(12) United States Patent
Moskowitz et al.

(10) Patent No.: US 10,852,562 B2
(45) Date of Patent: Dec. 1, 2020

(54) CONDUCTIVE CONNECTION THROUGH EYEWEAR HINGE

(71) Applicant: Snap Inc., Santa Monica, CA (US)

(72) Inventors: Douglas Wayne Moskowitz, Marina Del Rey, CA (US); David G. Fliszar, Manhattan Beach, CA (US); Martin Mape, Marina Del Rey, CA (US)

(73) Assignee: Snap Inc., Santa Monica, CA (US)

( * ) Notice: Subject to any disclaimer, the term of this patent is extended or adjusted under 35 U.S.C. 154(b) by 104 days.

(21) Appl. No.: 16/146,954

(22) Filed: Sep. 28, 2018

(65) Prior Publication Data

US 2019/0129200 A1 May 2, 2019

Related U.S. Application Data

(60) Provisional application No. 62/579,629, filed on Oct. 31, 2017.

(51) Int. Cl.
*G02C 5/22* (2006.01)
*G02C 11/00* (2006.01)
*H05K 7/20* (2006.01)
*H05K 7/02* (2006.01)

(52) U.S. Cl.
CPC .............. *G02C 5/2209* (2013.01); *G02C 5/22* (2013.01); *G02C 11/10* (2013.01); *H05K 7/02* (2013.01); *H05K 7/20445* (2013.01)

(58) Field of Classification Search
CPC ............................................ G02C 5/22–5/229
USPC .................................... 351/153, 158; 16/228
See application file for complete search history.

(56) References Cited

U.S. PATENT DOCUMENTS

| 6,168,341 | B1 | 1/2001 | Chene et al. |
| 8,353,593 | B2* | 1/2013 | Senatore ............. G02C 5/16 |
| | | | 351/158 |
| 9,442,305 | B2* | 9/2016 | Blum .................. H02J 7/00 |
| 9,740,023 | B1* | 8/2017 | Ashwood ............. G02C 5/22 |
| 2008/0013041 | A1 | 1/2008 | Chou |
| 2018/0049664 | A1 | 2/2018 | Miyazaki |
| 2019/0235274 | A1* | 8/2019 | Jouard ............... G02C 5/2209 |

FOREIGN PATENT DOCUMENTS

| WO | 0135159 | 5/2001 |
| WO | 2016194853 | 12/2016 |

(Continued)

OTHER PUBLICATIONS

"International Application Serial No. PCT US2018 058498, International Search Report dated Feb. 1, 2019", 4 pgs.

(Continued)

*Primary Examiner* — Darryl J Collins
(74) *Attorney, Agent, or Firm* — Schwegman Lundberg & Woessner, P.A.

(57) ABSTRACT

An eyewear device provides for routing a flexible conductive element or conductor through a hollow interior of a hinge mechanism that connects a temple of the eyewear device to its. The hinge mechanism comprises a pair of hinge pieces that defines a composite conduit through the hinge mechanism, conduit and hence the conductor routed through the passage being hidden or obscured from external view in any operational position of the hinge mechanism.

18 Claims, 8 Drawing Sheets

(56) References Cited

FOREIGN PATENT DOCUMENTS

WO        2017042510      3/2017
WO   WO-2019089785 A1    5/2019

OTHER PUBLICATIONS

"International Application Serial No. PCT US2018 058498, Written Opinion dated Feb. 1, 2019", 6 pgs.
"International Application Serial No. PCT/US2018/058498, International Preliminary Report on Patentability dated May 14, 2020", 8 pgs.

* cited by examiner

CONDUCTIVE CONNECTION THROUGH EYEWEAR HINGE

PRIORITY CLAIM

This application is a continuation of and claims the benefit of priority of U.S. Patent Application Ser. No. 62/579,629, filed on Oct. 31, 2017, which is hereby incorporated by reference herein in its entirety

BACKGROUND

Eyewear devices typically have a lens-holding frame and a pair of temples connected to the frame for supporting it on a user's face during use. To enable compact stowage of the eyewear device, the temples are typically hingedly connected to the frame.

Electronics-enabled eyewear devices (e.g., so-called smart glasses) often have separate components housed in the frame and the temple. Conductive coupling (e.g., for transmitting electrical power, data, or heat) of such components separated by a hinge mechanism is problematic due to requirements of aesthetics, durability, and reliability of connection.

BRIEF DESCRIPTION OF THE DRAWINGS

The appended drawings merely illustrate example embodiments of the present disclosure and cannot be considered as limiting its scope. To facilitate collation of numbered items in the description to the drawings, the first digit of each numbered item corresponds to the figure with respect to which that item is first described. In the drawings.

The headings provided herein are merely for convenience and do not necessarily affect the scope or meaning of the terms used.

DETAILED DESCRIPTION

The description that follows includes devices, systems, methods, techniques, instruction sequences, and computing machine program products that embody illustrative embodiments of the disclosure. In the following description, for the purposes of explanation, numerous specific details are set forth in order to provide an understanding of various embodiments of the disclosed subject matter. It will be evident, however, to those skilled in the art, that embodiments of the disclosed subject matter may be practiced without these specific details. In general, well-known instruction instances, protocols, structures, and techniques are not necessarily shown in detail.

One aspect of the disclosure provides for routing a flexible conductive element or conductor through a hollow interior of a hinge mechanism that connects a temple of an eyewear device to a frame of the eyewear device. Conductive coupling of respective components in the frame and the temple via the flexible conductor in some embodiments provides an electrical connection for providing electrical power to some components integrated in the eyewear device. Instead, or in addition, the conductive coupling may provide for a data connection. In a particular embodiment, the flexible conductor comprises a flexible printed circuit (FPC) having a flexible ribbon substrate carrying an integrated circuit thereon. In further embodiments, the conductive coupling via the conductor may provide a thermal connection. Such a thermal connection may in some embodiments comprise a flexible directional thermal conductor, such as a graphene sheet configured to conduct heat from heat-generating components in the frame to a heatsink in the temple.

The hinge mechanism in some embodiments comprises a pair of hinge pieces that define a composite passage or conduit through the hinge mechanism. The hinge mechanism may be configured such that the passage therethrough, and hence the conductor routed through the passage, is hidden or obscured from external view. In some embodiments, the conductor routed through the hinge mechanism is hidden from view both in a wearable position in which the corresponding temple is positioned for supporting the frame during wearing of the eyewear device, and in a collapsed position in which the temple is folded substantially flat against the frame.

Specific example embodiments of an eyewear device and hinge mechanisms corresponding to this aspect of the disclosure will now be described with reference to FIGS. 1-10.

Figure 1:
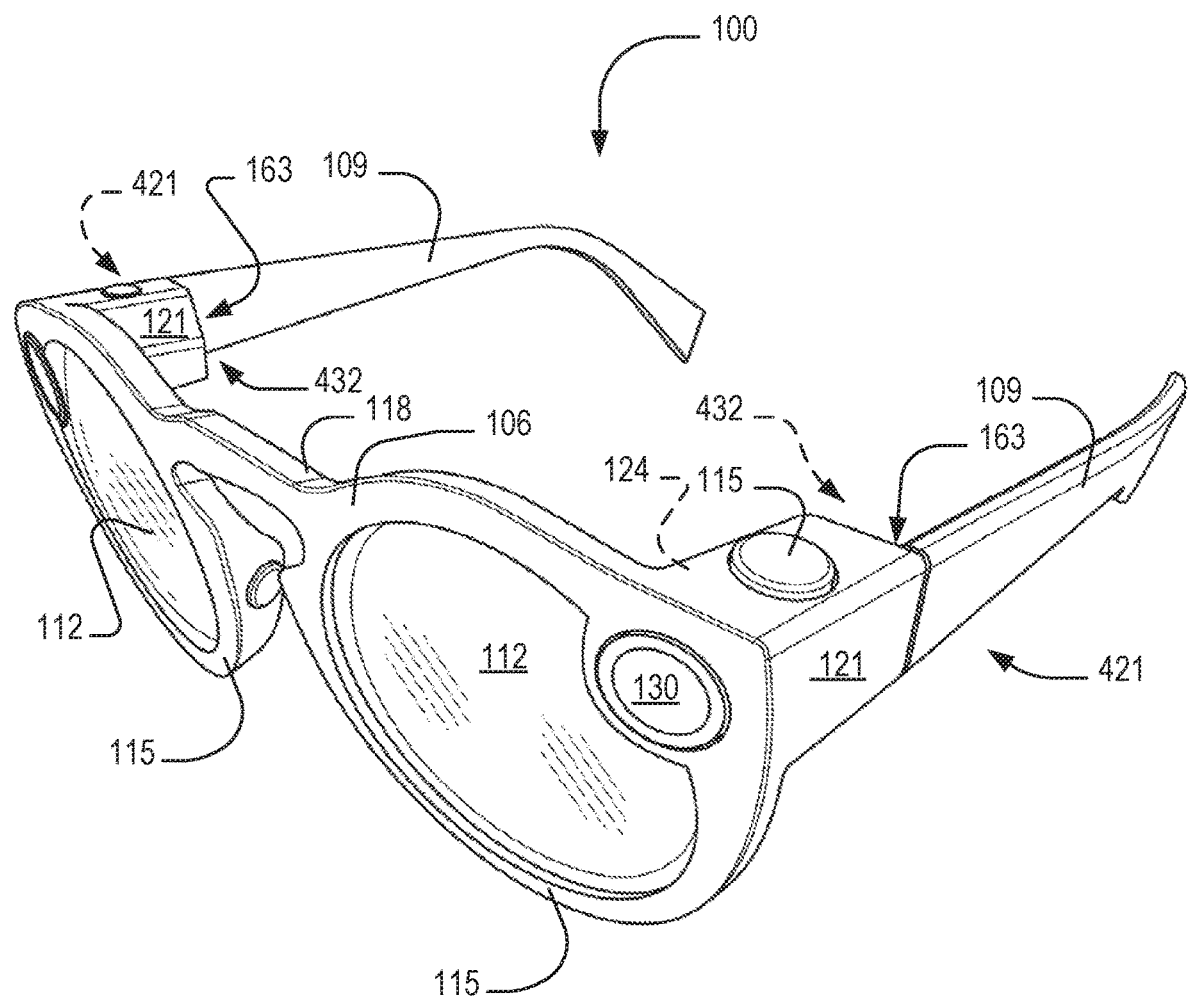
FIG. 1 is a schematic three-dimensional view of an eyewear device according to one example embodiment.

FIG. 1 shows a front perspective view of an electronics-enabled eyewear device 100 in the form of a pair of smart glasses. The eyewear device 100 includes a body comprising a front piece or frame 106 and a pair of temples 109 connected to the frame 106 for supporting the frame 106 in position on a user's face when the eyewear device 100 is worn. The frame 106 can be made from any suitable material such as plastics or metal, including any suitable shape memory alloy.

The eyewear device 100 has a pair of optical elements in the form of a pair of lenses 112 held by corresponding optical element holders in the form of a pair of lens rims 115 forming part of the frame 106. The rims 115 are connected by a bridge 118. In other embodiments, one or both of the optical elements can be a display (e.g., to provide a virtual reality display), a display assembly, or a lens and display combination (e.g., to provide augmented reality functionalities).

The frame 106 includes a pair of end pieces 121 defining lateral end portions of the frame 106. In this example, a variety of electronics components are housed in one or both of the end pieces 121. A push button 115 is provided on a top face of each of the end pieces 121, to allow user control of the operation of one or more functionalities of the electronic components provided by the eyewear device 100 by operation of the button(s) 115. In some embodiments, the frame 106 is formed of a single piece of material so as to have a unitary or monolithic construction.

The temples 109 are movably coupled to the respective end pieces 121. In this example, the temples 109 are coupled to the frame 106 by respective hinge mechanisms 163 so as to be hingedly movable between a wearable position (as shown in FIG. 1) and a collapsed mode or position in which the temples 109 are pivoted towards the frame 106 to lie substantially flat against it. Each of the temples 109 includes a front portion that is coupled to the frame 106 and a suitable rear portion for coupling to the ear of the user.

The eyewear device 100 has onboard electronics 124 including a computing device, such as a computer, which can in different embodiments be of any suitable type so as to be carried by the eyewear device body. In some embodiments, various components comprising the onboard electronics 124 are at least partially housed in one or both of the temples 109. As mentioned, various components of the onboard electronics 124 are instead or in addition housed within the lateral end pieces 121 of the frame 106. The onboard electronics 124 includes one or more processors with memory, wireless communication circuitry, and a power source (this example embodiment being a rechargeable battery. e.g. a lithium-ion battery). The onboard electronics 124 comprises low-power, high-speed circuitry, and, in some embodiments, a display processor. Various embodiments may include these elements in different configurations or integrated together in different ways. As mentioned, the onboard electronics 124 includes one or more rechargeable batteries. In some embodiments, the battery is disposed in one of the temples 109.

The eyewear device 100 is camera-enabled, in this example comprising a camera 130 mounted in one of the end pieces 121 and facing forwards so as to be aligned more or less with the direction of view of a wearer of the eyewear device 100. The camera 130 is configured to capture digital as well as digital video content. Operation of the camera 130 is controlled by a camera controller provided by the onboard electronics 124, image data representative of images or video captured by the camera 130 being temporarily stored on a memory forming part of the onboard electronics 124. In some embodiments, the eyewear device 100 can have a pair of cameras 130. e.g. housed by the respective end pieces 121.

The eyewear device 100 further includes one or more input and output devices permitting communication with and control of the camera 130. In particular, the eyewear device 100 include one or more input mechanisms for enabling user control of one or more functions of the eyewear device 100. In this embodiment, the input mechanism comprises the button 115. In the current example embodiment, a photo capture command can be issued by a single, relatively short button press (e.g., shorter than a second), while a video capture command can be issued by a press-and-hold action. Additional input channels can in some embodiments provided, e.g., comprising a tap input channel for communicating commands to the eyewear device 100 through a predefined sequence of physical taps recognized by accelerometers connected to the onboard electronics 124.

As mentioned, one or more of the temples 109 may in different embodiments include components that are conductively coupled to cooperating components in the frame 106. Such elements housed in one or more of the temples 109 can include electronic, data processing components, sensors, indicators, or the like, and/or battery components. In some embodiments, at least one of the temples 109 may include a heat sink element thermally coupled to one or more heat-generating components in the frame 106. In a particular example embodiment, a metal core wire of the temple 109 provides a heat sink that is connected by a thermally conductive path to the heat-generating electronics in the frame 106.

Figure 2:
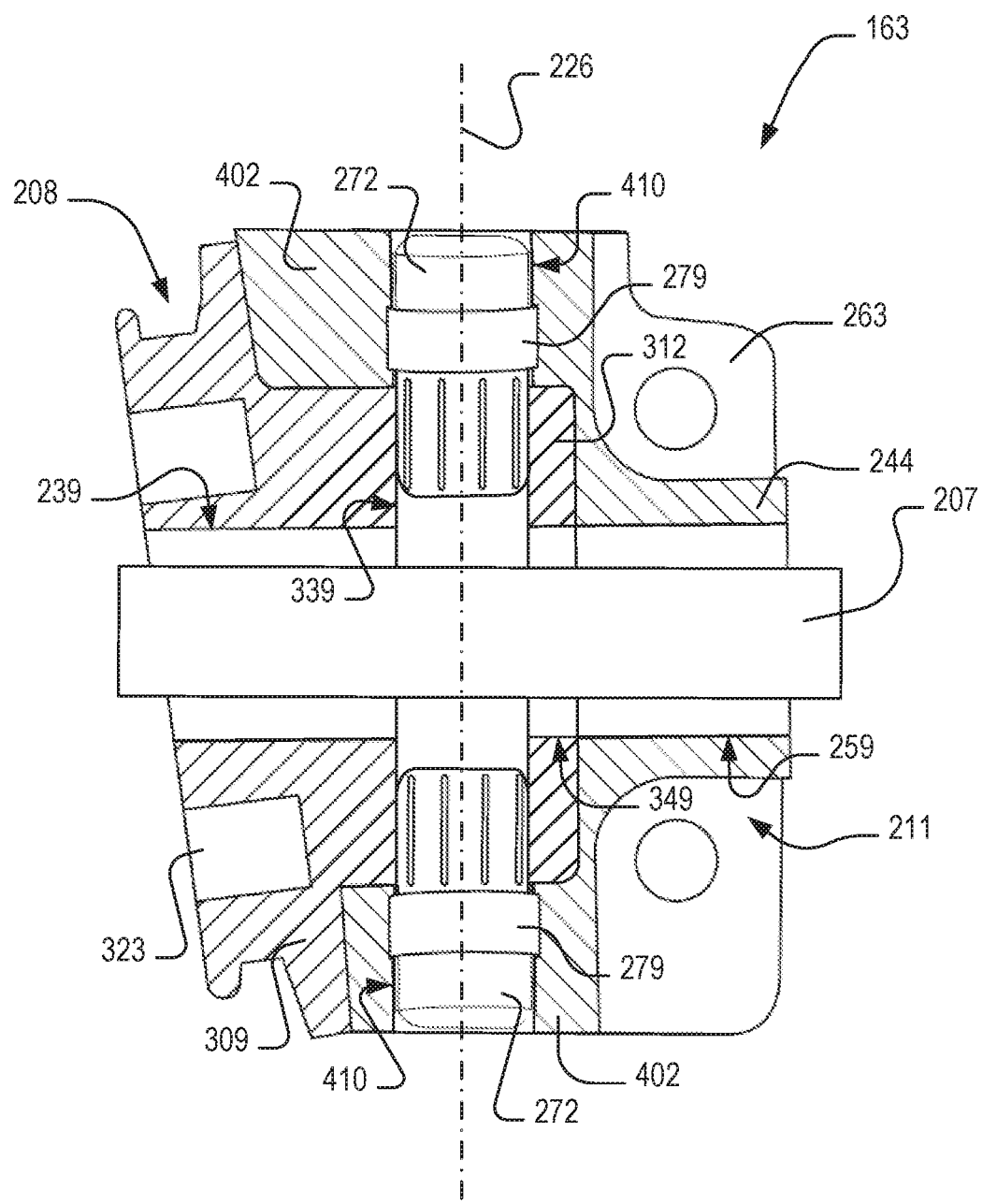
FIG. 2 is a cross-sectional view of a hinge mechanism for an eyewear device according to an example embodiment, the hinge mechanism connecting a temple of an eyewear device to its frame, a conductor extending between the frame and the temple via a hollow interior of the hinge mechanism.

Turning now to FIG. 2, therein is shown a hinge mechanism 163 incorporated in an eyewear device such as the example smart glasses 100 of FIG. 1, a conductor in the example form of a flexible printed circuit (FPC) 207 being routed through an isolated interior of the hinge mechanism 163, the hollow interior of the hinge mechanism 163 being isolated from the exterior of the hinge mechanism 163. In other example embodiments, the conductor routed through the hinge mechanism 163 can be a power cable, data cables (e.g. co-axial cables), and/or a flexible thermal conductor such as a graphene sheet.

The hinge mechanism 163 comprises a pair of hinge pieces in the example form of a frame piece 208 and a temple piece 211. In this example embodiment, the frame piece 208 and the temple piece 211 are respective metal components of one-piece construction. In particular, the hinge pieces are machined mild steel components. The frame piece 208 is fixedly mounted to the frame 106 of the eyewear device 100 (not shown in FIGS. 2-10), while the temple piece 211 is likewise fixedly mounted to a corresponding one of the temples 109 (for clarity of illustration also not shown in FIGS. 2-10). The hinge pieces 208, 211 are connected together for pivoting relative to one another about a hinge axis 226, thereby achieving hinged displacement of the corresponding temple 109 relative to the eyewear frame 106 about the hinge axis 226.

Figure 3:
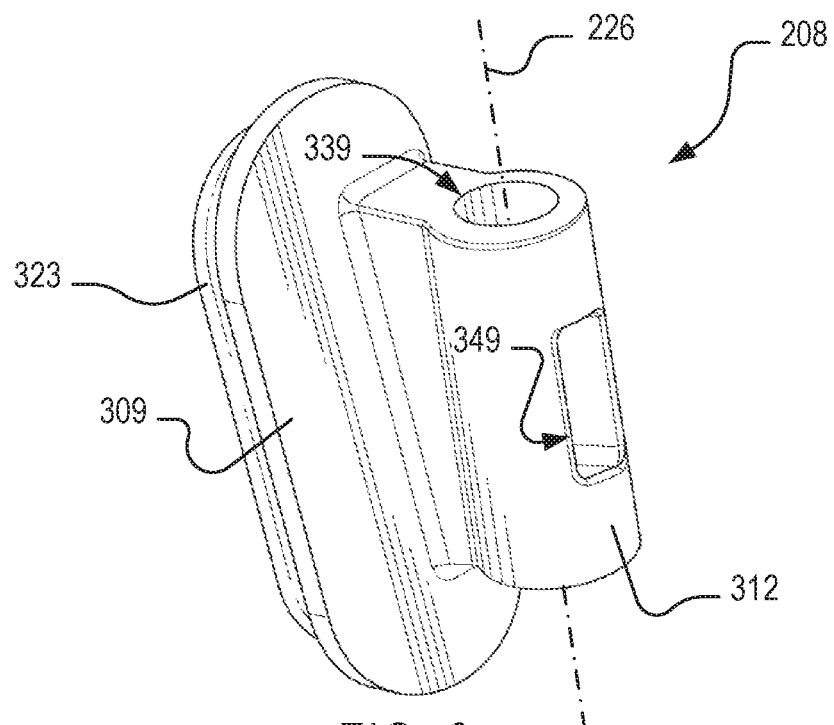
FIG. 3 is a schematic three-dimensional view of a frame piece providing one of a pair of hinge pieces together forming the hinge mechanism according to the example embodiment of FIG. 2.

Turning briefly to FIG. 3, therein is shown a schematic three-dimensional view of the frame piece 208 in isolation. The frame piece 208 includes a body portion 309 and, integrally connected therewith, a hinge formation in the form of a tubular central hinge knuckle 312. The body portion 309 has a mounting formation 323 for fixedly attaching the frame piece 208 to the corresponding end piece 121 of the eyewear frame 106 (FIG. 1).

The central hinge knuckle 312 has a circular cylindrical bore 339 co-axial with the hinge axis 226 and extending all the way through the hinge knuckle 312. As will be seen when the description returns to FIG. 2, the hollow interior of the hinge knuckle 312 provided by its bore 339 forms an internal hinge cavity for the hinge mechanism 163, through which the conductor in the example form of the FPC 207 is routed. The hinge knuckle 312 further includes an opening 349 at a side of the hinge knuckle 312 furthest from the body portion 309. Note that the opening 349 extends transversely (relative to the hinge axis 226) through the circular cylindrical wall of the hinge knuckle 312, connecting to the bore 339 of the central hinge knuckle 312.

Returning briefly to FIG. 2, it will be seen that the body portion 309 of the frame piece 208 defines a passage 239 extending through the body portion 239 and into communication with the internal cavity of the hinge mechanism 163 provided by hollow interior bore 339 of the hinge knuckle 312. The passage 239 is open at both ends, at its frame end being in communication with an interior cavity of the eyewear frame 106 (not shown in FIG. 2), and at its other end opening out transversely (relative to the hinge axis 226) into the internal hinge cavity provided by the bore 339 of the central hinge knuckle 312.

Similar to the frame piece 208, the temple piece 211 has a body portion 244 with a mounting formation 263 fixedly attaching the temple piece 211 to the corresponding temple 109. The body portion 244 of the temple piece 211 likewise defines a passage 259 therethrough for routing the FPC 207 to the interior of the temple 109. The passage 259 of the temple piece 211 is aligned with the passage 239 of the frame piece 309 when the hinge mechanism 163 is in the wearable position, as represented in FIG. 2. In the wearable position, the passage 259 of the temple piece 211 is thus in communication with the hollow cylindrical interior 339 of the frame piece 309 via the opening 349 in the central hinge knuckle 312, the passage 259 extending transversely to the hinge axis 226.

Figure 4:
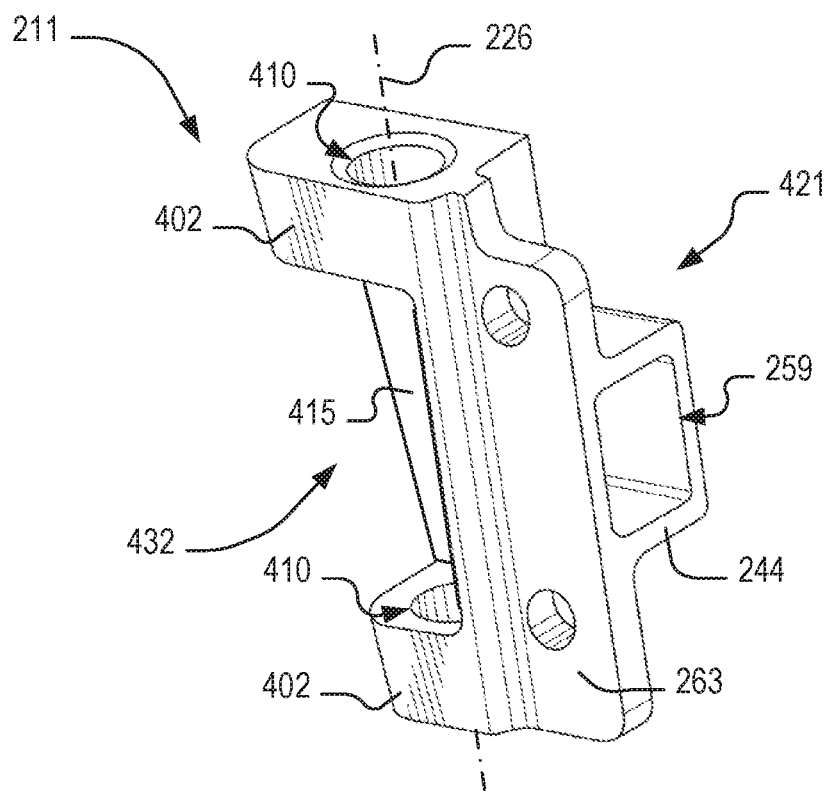
FIG. 4 is a schematic three-dimensional view of a temple piece providing the other one of the pair of hinge pieces together forming the hinge mechanism according to the example embodiment of FIG. 2.
Figure 5:
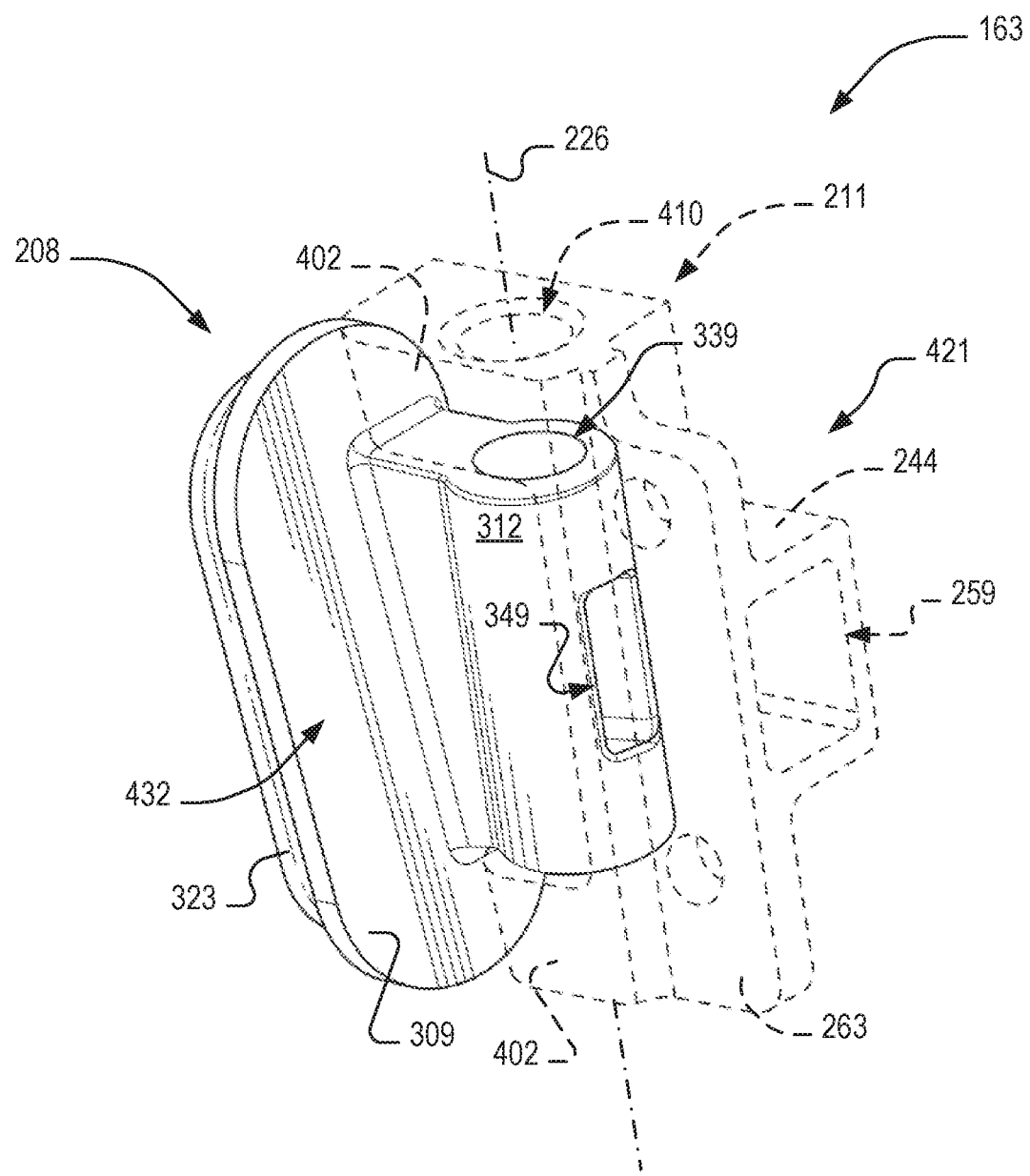
FIG. 5 is a schematic three-dimensional view of the hinge mechanism according to the example embodiment of FIG. 2, the temple piece of the hinge mechanism being shown in broken lines to afford a view of a hidden hinge cavity provided by the frame piece.

As can best be seen in FIG. 4, the temple piece 211 has a hinge formation in the form of a pair of end knuckles 402 with respective co-axial hinge sockets 410 defining the hinge axis 226. The temple piece 211 is laterally asymmetrical, having a side wall 415 on its laterally outer side 421 (i.e., that side of the hinge mechanism 163 that faces laterally away from the user's temples when the eyewear device 100 is worn), covering the central hinge knuckle 312 of the frame piece 208 from lateral view when the hinge mechanism 163 is in the wearable position.

Returning again to FIG. 2, it can be seen that the temple piece 211 is connected to the hinge piece 208 for relative pivoting about the hinge axis 226 by a pair of hinge pins 272, each of which is located partially in one of the hinge sockets 410 and partially in a corresponding axial end of the cylindrical bore 339 of the frame piece 208. Axially inner ends of the hinge pins 272 are co-axially press-fit into the axially opposite ends of the cylindrical bore 339, thus providing substantially watertight sealing of the bore 339. A bearing 279 on each of the hinge pins 272 is engaged with the interior of the corresponding hinge socket 410 to allow pivoting of the temple piece 211 relative to the frame piece 208 about the hinge axis 226.

Thus, the conductor in the example form of the FPC 207 extends between the eyewear frame 106 and the corresponding temple 109 through a composite conduit or passage defined by a hollow interior of the hinge mechanism 163. In this example embodiment, the FPC 207 extends through the transverse passage 239 of the frame piece 208, through the central cylindrical bore 339 of the central hinge knuckle 312, through the opening 349 in the side wall of the central hinge knuckle 312, and through the transverse passage 259 of the temple piece 211. Note that the FPC 207 extends centrally through the central hinge knuckle 312, so that the FPC 207 (having some latitude or play within the bore 339) can at times intersect the hinge axis 226.

Figure 6A:
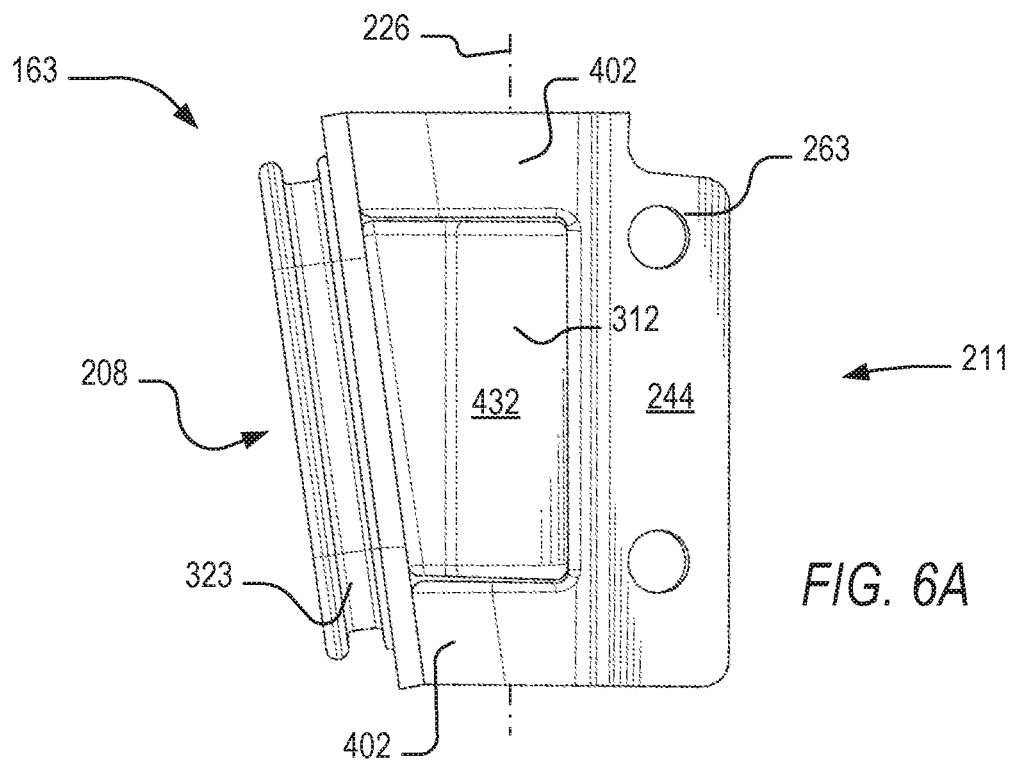
FIG. 6A is a schematic side view of the hinge mechanism according to the example embodiment of FIG. 2, the hinge mechanism being disposed in a wearable position and being viewed from a laterally inner side of the hinge mechanism.

FIG. 6A shows the hinge mechanism 163 in the wearable position, seen from the laterally inner side 432 (see also FIG. 1) of the hinge mechanism 163. As can be seen, the entirety of the composite conduit through the interior of the hinge mechanism 163 (here, the passages 259, 239 and the bore 339), and consequently the FPC 207 routed therethrough, is wholly hidden from external view. Thus, the conductor extending through the hinge mechanism 163 is obscured from view by the hinge mechanism components. Further, the hinge cavity is here substantially water-tight, due at least in part to sealing connection of the hinge pins 272 to the central hinge knuckle 312. The same considerations apply to the hinge mechanism 163 in the closed position when seen from the opposite, laterally outer side 421. In fact, the hinge knuckles 312, 402 are themselves obscured from the outer side 421 by the side wall 415 of the temple piece 211, when the hinge mechanism 163 (and hence the corresponding temple 109) is in the wearable position.

Figure 6B:
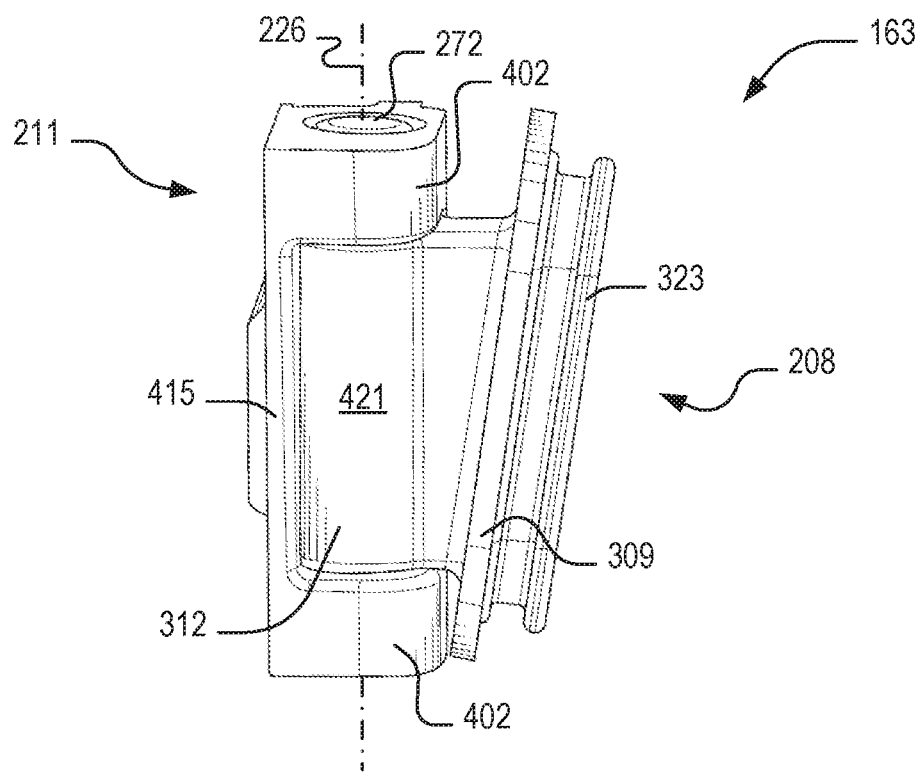
FIG. 6B is a schematic side view of the hinge mechanism according to the example embodiment of FIG. 2, the hinge mechanism being disposed in a collapsed position and being viewed from a laterally outer side of the hinge mechanism.

FIG. 6B shows the hinge mechanism 163 in the collapsed position, but viewed from the opposite lateral side from that shown in FIG. 6A. i.e. being viewed from the laterally outer side 421 of the eyewear device 100. Again, the entirety of the composite conduit through the interior of the hinge mechanism 163, and therefore also the FPC 207, is obscured from external view. In particular, note that the opening 349 in the central hinge knuckle 312 is covered by the sidewall 415 of the temple piece 211.

Thus, the hinge mechanism 163 provides a hollow interior that serves as a conduit for the FPC 207, such that the FPC 207 is obscured from external view in all of the operable positions of the hinge mechanism 163. A benefit of the described hinge mechanism 163 is that it provides for space saving in an electronics-enabled eyewear device, in which available component space is at a premium. In this example embodiment, routing of a conductor in the example form of the FPC 207 through the hinge mechanism 163 allows for construction of a low-profile hinge mechanism in which the lengthwise direction of the corresponding temple 109 is substantially in line with the hinge axis 226.

The exemplified hinge mechanism 163 also has the benefit of providing an aesthetically pleasing solution to the problem of providing a conductive connection between components opposite sides of the hinge mechanism 163. To the user, there is only a hinge as with the found in traditional glasses. Connection of the hinge pins 272 from the outside prevent tampering and the loosening with cycling.

Note also that the hinge axis 226 intersects of the internal hinge cavity 339 through which the FPC 207 extends, which provides a number of benefits. One of these is that the distance along the conductor between the ends of the conductor (being fixed to the respective components in the frame 106 and the temple 109) remains substantially constant during hinge displacement of the temple 109 relative to the frame 106. To illustrate this benefit, consider an alternative example embodiment in which a conductor (such as the FPC 207 in the described example) is routed through an internal hinge cavity, but around a single hinge pin that extends along the hinge axis 226. The flexible conductor would then be placed under stress or need to take up slack responsive to hinged movement of the temple 109, as the distance along the conductor around the outside or the inside of the hinge pin changes during hinging. Such difficulties are apply even more so in eyewear devices in which a flexible conductor is routed between the temple and frame outside of the hinge mechanism.

FIGS. 7-10 illustrate another example embodiment of a hinge mechanism 700 according to the disclosure. The hinge mechanism 700 employs substantially similar techniques to that described with reference to hinge mechanism 163 in FIGS. 2-6, a major distinction being that one of the hinge pieces defines a pair of passages through its body portion, routing a respective pair of cables into a single, common passage in the other hinge piece. These distinctions will be evident from the description that follows.

Figure 7:
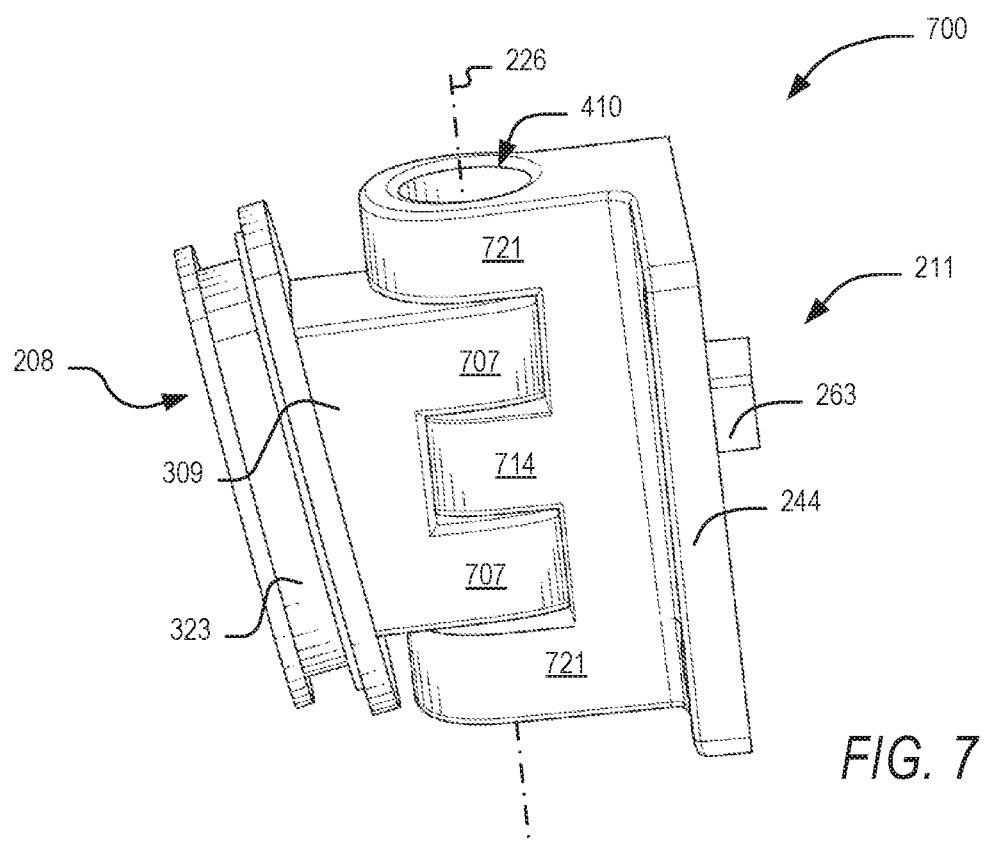
FIG. 7 is a schematic three-dimensional view of a hinge mechanism for an eyewear device according to another example embodiment.

Turning first to FIG. 7, it will be seen that the hinge formations of the hinge mechanism 700 comprises five intermeshed hinge knuckles consisting of a central knuckle 714 flanked by a co-axial pair of intermediate knuckles 707, which are in turn flanked by a co-axial pair of end knuckles 721. In this example embodiment, the pair of intermediate knuckles 707 are provided by the hinge formation of the frame piece 208, while the central knuckle 714 and the pair of end knuckles 721 are provided by the hinge formation of the temple piece 211.

Figure 8:
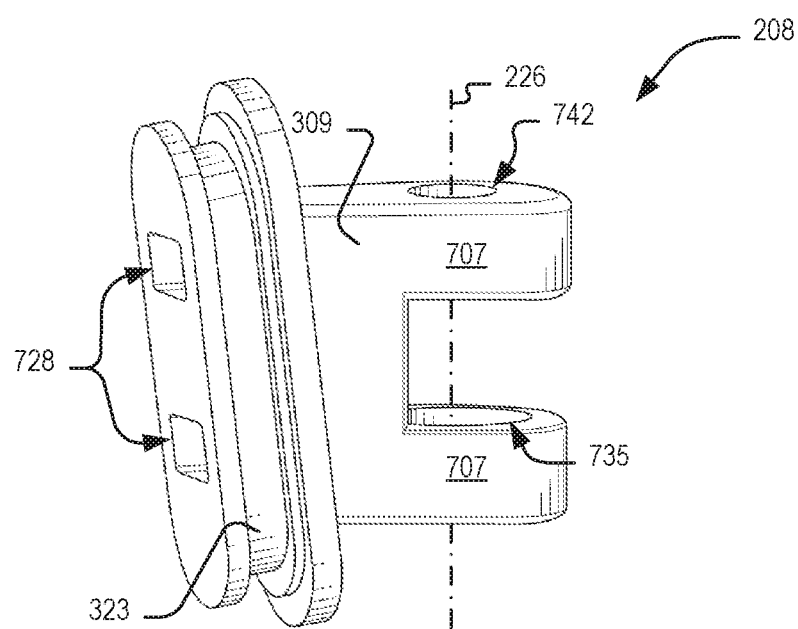
FIG. 8 is a schematic three-dimensional view of a frame piece providing one of a pair of hinge pieces together forming the hinge mechanism according to the example embodiment of FIG. 7.

In FIG. 8, which shows the frame piece 208 in isolation, it can be seen that the body portion 309 of the frame piece 208 defines a pair of passages 728 for housing respective cables. Each of the passages 728 lead into a hollow interior of a corresponding one of the intermediate knuckles 707, which defines a channel 735 opening out axially towards the gap between the intermediate knuckles 707 in which the central knuckle 714 is to be received. The axially outer side of each intermediate knuckle 707 defines a hinge-pin hole 742 for receiving a respective hinge pin 272.

Figure 9:
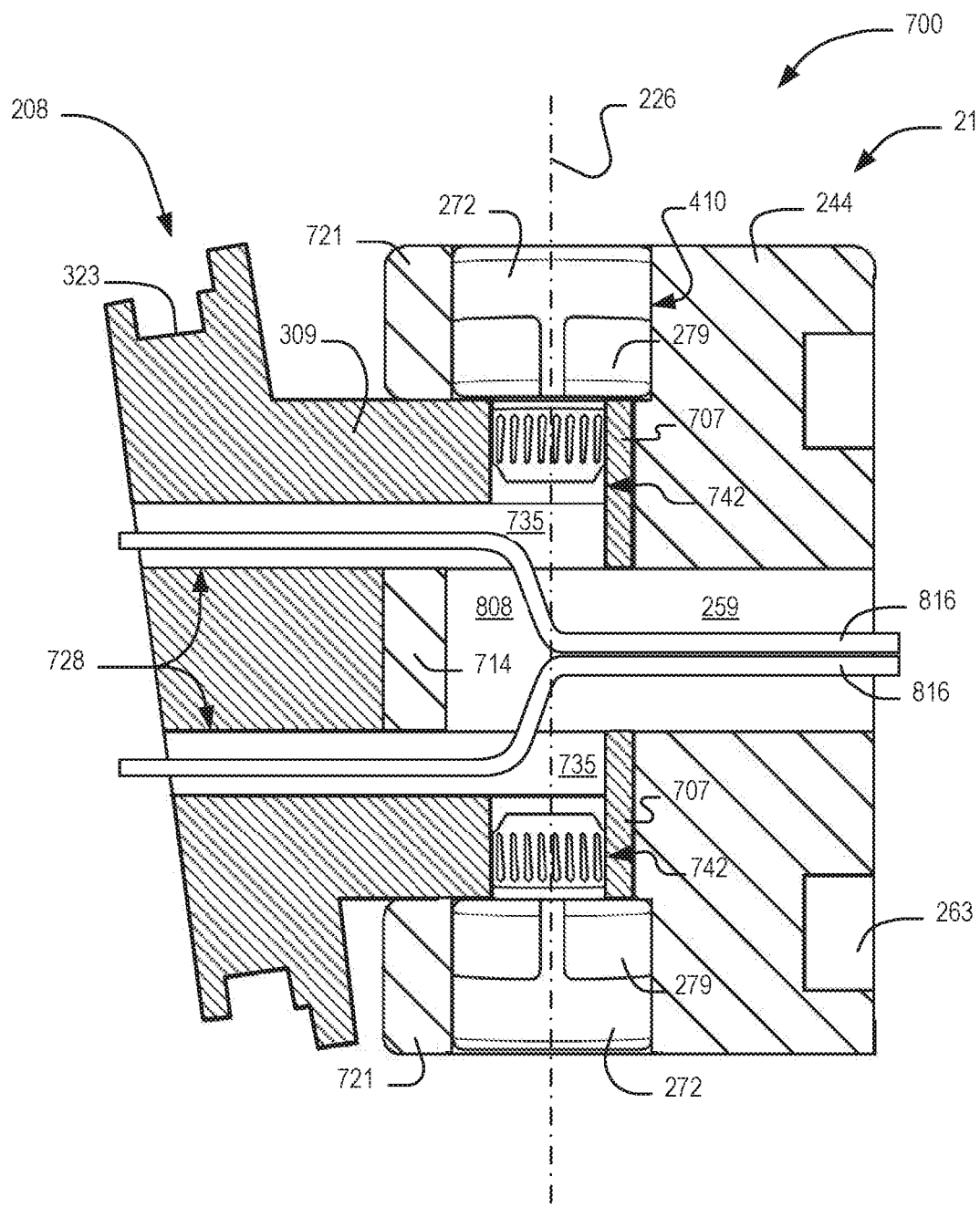
FIG. 9 is a schematic cross-sectional side view of a hinge mechanism according to the example embodiment of FIG. 7.

FIG. 9 shows a cross-sectional side view of the hinge mechanism 700, with a pair of co-axial cables 816 routed therethrough. As can be seen in FIG. 9, the central knuckle 714 of the temple piece 211 defines a hollow hinge loop which is axially open to both sides thereof. The interior of the central knuckle 714 thus defines a loop opening 808 that is connected to a passage 259 extending through the body portion 244 of the temple piece 211.

Similar to the hinge mechanism 163, the hinge pieces 208, 211 of the hinge mechanism 700 are connected together by a pair of hinge pins 272. The hinge pins 272 are received in respective hinge sockets 410 defined by the end knuckles 721 of the temple piece 211. Stepped down axially inner ends of the hinge pins 272 are press fit into the respective hinge-pin holes 742 of the intermediate knuckles 707.

When the hinge pieces 208, 211 are thus connected together, the channels 735 of the respective intermediate knuckles open out axially into the loop opening 808 of the central knuckle 714. In this manner, the respective passages 728 of the frame piece 208 are placed in communication with the passage 259 of the temple piece 211, via the channels 735 and the opening 808. Note that the internal hinge cavity of the hinge mechanism 700 is thus in this example embodiment provided at least in part by the loop opening 808 of the central knuckle 714, the internal hinge cavity again intersecting the hinge axis 226.

In this example embodiment, the composite conduit thus provided through the hinge mechanism 700 is employed to route a pair of co-axial cables 816 through the hinge mechanism 700, conductively connecting respective components in the frame 106 and the temple 109. It is again emphasized that the passages 728 of the frame piece 208 are in communication with a sealed interior of a respective end piece 121 of the frame 106, and that the passage 259 of the temple piece 211 is likewise in communication with a sealed interior of a respective temple 109. The composite conduit of the hinge mechanism 163 thus places the interiors of the frame 106 and the temple 109 in communication, with any exposure to the exterior of the hinge mechanism 163. Each of the cables 816 extend from the frame 106 along a respective one of the passages home 503 of the frame piece, extending into a respective one of the open channels 735 of the intermediate knuckles 707. From these channels 735, each cable 816 enters more or less axially into the loop opening 808, from where both cables 816 together extend into and through common passage 259 through the temple piece 211.

Figure 10:
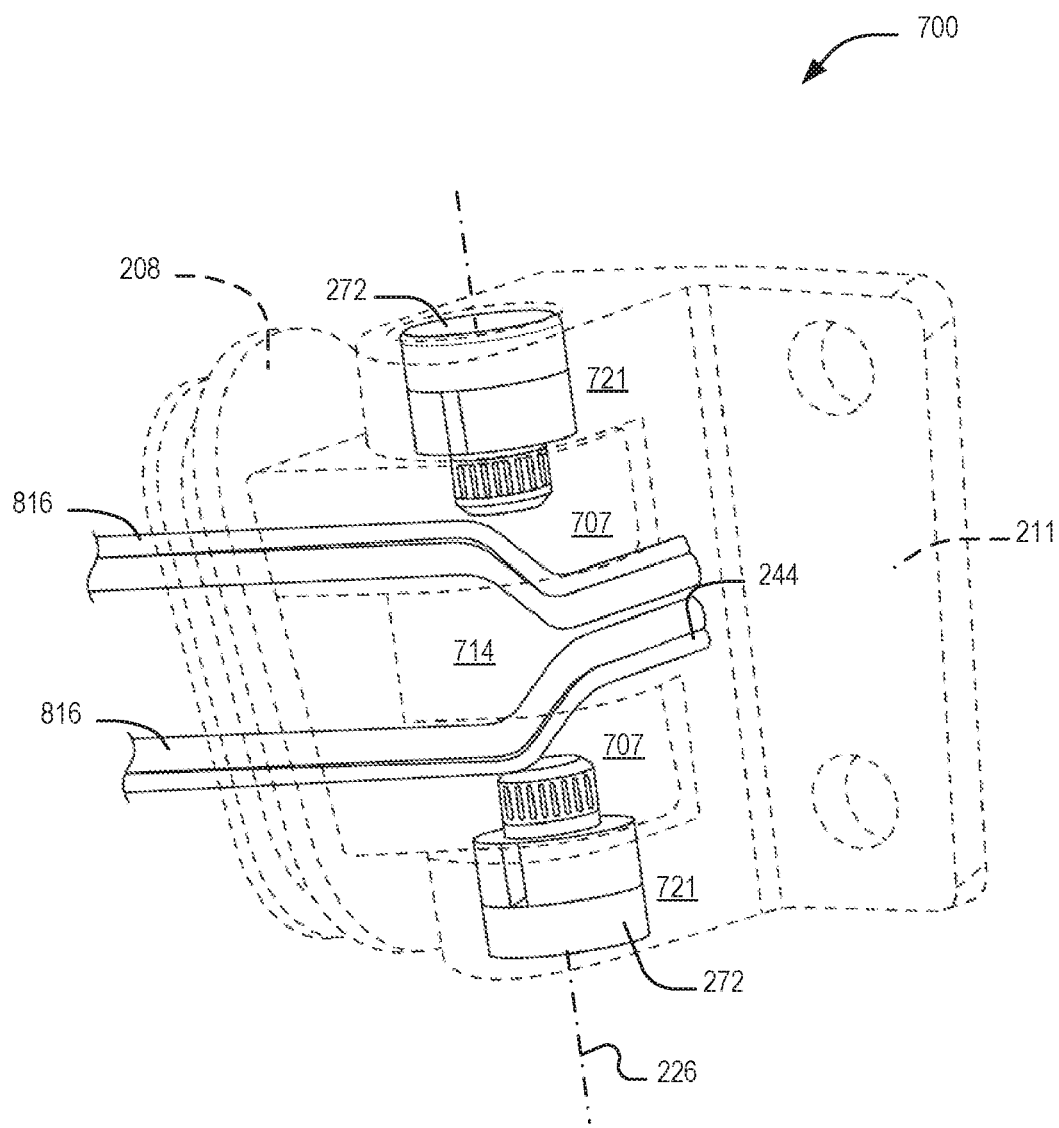
FIG. 10 is a schematic three-dimensional view of the hinge mechanism according to the example embodiment of FIG. 7, respective hinge pieces being shown in broken lines to expose co-axial cables routed through a composite hollow interior of the hinge mechanism.

FIG. 10 schematically shows the disposition of the cables 816 when the hinge mechanism 163 is hingedly disclosed from the wearable position shown in FIG. 9 into the collapsed condition. It will be seen that the cable 816 flexes or bends more or less about the hinge axis 226, thus achieving the earlier-described benefits associated with routing a flexible conductor centrally through the hinge mechanism 700. Note also that multiple cables can be routed through each path.

It will be noted from FIG. 7 and FIG. 10 that none of the cavities of the composite conduit through the hinge mechanism 700 is visible from the exterior in any one of the operational positions of the hinge mechanism 700. In particular, the passages 728 and 259 are obscured by the frame 106 and the temple 109 respectively. The open channels 735 of the intermediate knuckles 707 are obscured by the loop of the central knuckle 714 receive between them. Likewise, the loop opening 808 of the central knuckle 714 is obscured by the pair of intermediate knuckles 707 flanking it. Thus, the hinge mechanism 700 has a traditional hinge appearance, concealing electrical connections routed therethrough.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the disclosed matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. An eyewear device comprising:
a frame holding one or more optical elements;
a temple coupled to the frame for supporting the frame in position during wearing of the eyewear device;
a hinge mechanism formed by a pair of complementary hinge formations located on end portions of the frame and the temple respectively, the hinge mechanism coupling the temple to the frame to permit hinged movement about a hinge axis defined by the hinge mechanism between a wearable position and a collapsed position,
wherein the hinge mechanism defines an internal hinge cavity that is hidden from external view and that coincides at least partially with the hinge axis, and
wherein the end portions of the frame and the temple each defines a respective passage extending therethrough into communication with the hinge cavity, the passage through at least a first one of the end portions opening axially into the hinge cavity; and
a conductor extending between the frame and the temple via the hinge mechanism to provide a conductive coupling between components incorporated in the frame and the temple respectively, the conductor extending axially into the hinge cavity through the passage of said first end portion, through the hinge cavity, and through the passage of the other one of the end portions.

2. The eyewear device of claim 1, wherein the hinge formations of the hinge mechanism are provided by a pair of hinge pieces incorporated in the frame and the temple respectively, each hinge piece comprising:
a body portion attached to the frame or the temple respectively; and
the respective hinge formation attached to the body portion and hingedly engaged with the complementary hinge formation of the other hinge piece, together forming the hinge mechanism.

3. The eyewear device of claim 2, wherein each hinge piece is a metal component of one-piece construction.

4. The eyewear device of claim 3, wherein at least one of the hinge formations comprises a substantially tubular hinge knuckle having a substantially cylindrical interior that at least partially defines the hinge cavity and that is substantially co-axial with the hinge axis.

5. The eyewear device of claim 1, wherein the hinge cavity and the passages of the pair of end portions are obscured from external view both in the wearable position and in the collapsed position.

6. The eyewear device of claim 1, wherein:
the hinge formation of one of the end portions comprises a pair of tubular end knuckles that are co-axial with the hinge cavity and that are located at opposite axial ends of the hinge cavity; and
wherein the hinge mechanism further comprises a pair of hinge pins pivotally connecting the complementary hinge formations, the pair of hinge pins being located in the pair of end knuckles such as close off opposite axial ends of the hinge cavity.

7. The eyewear device of claim 1, wherein the respective passage defined by a second one of the end portions opens out transversely into the hinge cavity, so that the conductor passes transversely through the passage of the second end portion into the hinge cavity.

8. The eyewear device of claim 7, wherein the conductor extends:
through the first end portion;
axially along at least part of the hinge cavity; and
from there transversely through the second end portion.

9. The eyewear device of claim 1, wherein one of the pair of end portions defines a pair of passages extending separately therethrough and opening separately into the hinge cavity.

10. The eyewear device of claim 9, wherein the hinge formation of said one end portion comprises a pair of tubular hinge knuckles co-axially flanking a central hinge knuckle provided by the hinge formation of the other one of the end portions,
wherein the hinge cavity is defined by a hollow interior of the central hinge knuckle, the passage of said other end portion extending into the interior of the central hinge knuckle, and
wherein the pair of passages through said one end portion extend into respective hollow interiors of the pair of hinge knuckles of said one end portions, the interiors of the pair of hinge knuckles being in communication with the hinge cavity of the central hinge knuckle at opposite axial ends thereof.

11. The eyewear device of claim 1, wherein the conductor is an electrical conductor connected to an onboard battery of the eyewear device to power electronic components across the hinge mechanism.

12. The eyewear device of claim 1, wherein the conductor establishes a data connection across the hinge mechanism between electronic components in the frame and in the temple respectively.

13. The eyewear device of claim 1, wherein the conductor is a thermal conductor configured to conduct heat across the hinge mechanism from a heat generating component to a heatsink element.

14. A hinge mechanism comprising:
a pair of hinge pieces configured for coupling a frame of an eyewear device to a temple of the eyewear device to permit hinged movement of the temple relative to the frame about a hinge axis, each hinge piece comprising:
a hinge formation that is hingedly engaged with a complementary hinge formation of the other hinge piece, the engaged hinge formations defining an internal hinge cavity that is hidden from external view and that coincides at least partially with the hinge axis; and
a body portion fixedly attached to the respective hinge formation, the body portion defining a passage that extends therethrough and that is in communication with the hinge cavity, wherein the passage of a first one of the pair of hinge pieces opens axially into the hinge cavity; and a conductor that extends axially into the hinge cavity through the passage of the first hinge piece, through hinge cavity, and through the passage of the other hinge piece, such that the conductor is obscured from external view at the engaged hinge formations.

15. The hinge mechanism of claim 14, wherein the pair of hinge pieces are hingedly disposable between an open and a closed position, the hinge cavity and the passages of the pair of hinge pieces being obscured from external view both in the open position and the closed position.

16. The hinge mechanism of claim 14, wherein each hinge piece is a metal component of one-piece construction.

17. The hinge mechanism of claim 14, wherein at least one of the hinge formations comprises a substantially tubular hinge knuckle having a substantially cylindrical interior that at least partially defines the hinge cavity and that is substantially co-axial with the hinge axis.

18. The hinge mechanism of claim 14, wherein the conductor is an electrical conductor.

\* \* \* \* \*